United States Patent
Clark et al.

(10) Patent No.: US 7,112,288 B2
(45) Date of Patent: Sep. 26, 2006

(54) METHODS FOR INSPECTION SAMPLE PREPARATION

(75) Inventors: Fred Y. Clark, Rowlett, TX (US); Andrew L. Vance, Rowlett, TX (US); David G. Farber, Wylie, TX (US)

(73) Assignee: Texas Instruments Incorporated, Dallas, TX (US)

( * ) Notice: Subject to any disclaimer, the term of this patent is extended or adjusted under 35 U.S.C. 154(b) by 367 days.

(21) Appl. No.: 10/218,046

(22) Filed: Aug. 13, 2002

(65) Prior Publication Data

US 2004/0033631 A1    Feb. 19, 2004

(51) Int. Cl.
*G01R 31/00* (2006.01)
(52) U.S. Cl. .................... 216/59; 216/60; 216/62; 216/72; 438/712
(58) Field of Classification Search .............. 216/59, 216/60, 62, 67, 72; 438/712
See application file for complete search history.

(56) References Cited

U.S. PATENT DOCUMENTS

| 5,933,704 | A | | 8/1999 | Hwang et al. |
| 5,960,306 | A | * | 9/1999 | Hall et al. .................. 438/612 |
| 6,162,735 | A | | 12/2000 | Zimmermann et al. |
| 6,284,657 | B1 | * | 9/2001 | Chooi et al. ................. 438/687 |
| 6,548,417 | B1 | * | 4/2003 | Dao et al. ................... 438/710 |
| 6,699,795 | B1 | * | 3/2004 | Schwarz et al. ............. 438/717 |

\* cited by examiner

*Primary Examiner*—Duy-Vu N. Deo
*Assistant Examiner*—Binh X. Tran
(74) *Attorney, Agent, or Firm*—Jacqueline J. Garner; W. James Brady, III; Frederick J. Telecky, Jr.

(57) ABSTRACT

Methods are provided for delineating different layers and interfaces for inspection of a semiconductor wafer, wherein a sectioned portion of a wafer is subjected to a reactive ion etch process before inspection using a scanning electron microscope.

12 Claims, 9 Drawing Sheets

METHODS FOR INSPECTION SAMPLE PREPARATION

FIELD OF INVENTION

The present invention relates generally to semiconductor devices and more particularly to methods for preparing semiconductor device samples for inspection.

BACKGROUND OF THE INVENTION

During the fabrication of semiconductor products, many processing steps are performed, including deposition, etching, patterning, implanting, reacting, and others, by which transistors and other electrical devices are formed and interconnected. Semiconductor manufacturers continually strive to reduce or streamline the number and duration of such processing steps, so as to increase product throughput and reduce product cost. The manufacturing processes are also optimized to improve device performance parameters and to increase device yields. In order to refine and optimize a given process flow, it is necessary to test or measure not only the electrical performance of the devices in a wafer, but also the physical properties of the structures being formed at any given point in the flow. For instance, it is often desirable to know the thicknesses of various material layers, to allow accurate adjustment of etching steps, planarization steps, or the like. In addition to optimizations, devices are often inspected to assess the continued performance of existing process flows, identify process drift, and/or the effects of material substitutions, etc.

Whereas device electrical performance in production wafers may be scrutinized to some extent using non-destructive wafer testing (e.g., prior to separation of individual device die and/or following device packaging), the physical characteristics of the structures being processed at any given point in the process flow are typically ascertained only by destructive testing of a sample wafer removed from the process. For example, where it is desired to know the extent to which a dielectric etch penetrates an etch-stop layer, a sample wafer may be removed from the process flow immediately following the etch step of interest, and sectioned for inspection using a scanning electron microscope or other metrology instrument.

The etch results may be desired to quantify etch selectivity of the process, etch rates, and/or remaining etch-stop layer thickness. Knowing the process performance, in turn, allows optimization, for instance, wherein the etch duration may be shortened according to the remaining etch-stop layer thickness. These inspections may occur, for example, in qualification of process flows prior to full scale manufacturing and/or periodically during production to verify whether process parameters are still within expected ranges. In addition to process optimization utility, the inspection of physical characteristics of a device during processing may be used to identify potential reliability problems, and to make process adjustments accordingly.

After sectioning, the exposed surface (cross-section) of the wafer is typically stained via a wet etch process, sometimes referred to as a standard oxide stain operation (SO staining). Other methods, including buffered oxide etch processing and mechanical polishing techniques, have been used in preparing the sectioned surface of interest for inspection. The sectioned surface preparation is done so as to facilitate accurate measurement of critical dimensions related to processing steps performed prior to sectioning, by delineating or differentiating the various layers of different materials from one another. The SO staining etch, for example, has been successfully employed in delineating silicon oxide ($SiO_2$) dielectric layers from underlying silicon nitride (SiN) etch-stop layers to evaluate trench and/or via etch steps during damascene-type interconnect processing.

As device speeds continue to increase and as feature sizes and spacings continue to decrease, low-k dielectric materials are becoming more popular in forming inter layer dielectrics (ILD) in back-end interconnect processing. In addition, the dielectric constants of etch-stop layer materials are also being reduced, so as to increase operating speeds of the finished integrated circuit devices. For example, recent trends in ILD layer formation and processing include the use of carbon doped (C-doped) $SiO_2$ for ILD layers and silicon carbide (SiC) type materials for etch-stop layers. In this case, the ILD and etch-stop layer materials are of more similar composition than were the previously popular $SiO_2$ and SiN materials.

However, as the types of materials used in the ILD, etch-stop, hard mask, and other layers have become similar in composition, the conventional sample preparation techniques such as SO wet etch staining have become increasingly ineffective in delineating materials in different layers. Inspection of other types of layers at different points in the manufacturing flow has also suffered from the use of somewhat more similar compositions in adjacent layers in semiconductor wafers. Thus, difficulties are now arising in inspection of interconnect layers using other low-k dielectrics such as spin-on glass (SOG) films, and in other situations where adjacent layers need to be delineated. Thus, there is a need for improved sample preparation techniques by which features of interest can better be delineated for inspection in the manufacture of semiconductor devices.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later. The invention relates to methods for wafer sample preparation and inspection, in which an exposed sectioned surface of a wafer to be inspected is anisotropically etched to delineate layers of different material and/or the interfaces therebetween for subsequent inspection.

A reactive ion etch (RIE) process may be used, wherein the etch directionality is oriented substantially perpendicular to the plane of the sectioned surface of interest. The anisotropic sample preparation etching facilitates differentiation between the sample features of interest, such as layer thicknesses, contours, and interfaces between adjacent layers, in subsequent inspection using scanning electron microscopes (SEM) or other metrology tools. In another aspect of the invention, the etch selectivity of the RIE etch chemistry may be adjusted to preferentially remove material from one layer of interest faster than from an adjacent layer, so as to further facilitate delineation of the layers and/or the interfaces between adjacent layers.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

Figure 1:
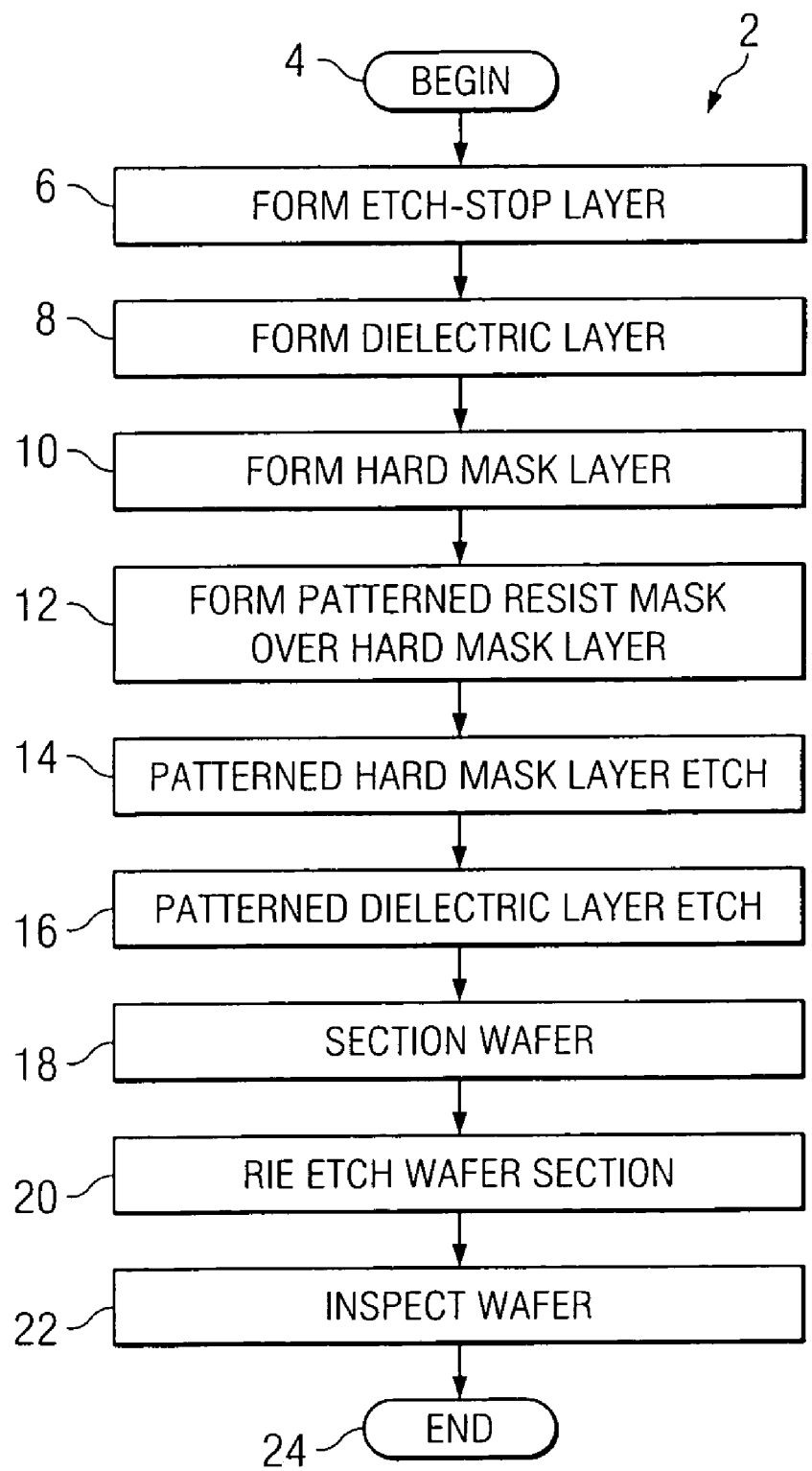
FIG. 1 is a flow diagram illustrating an exemplary method of preparing and inspecting a wafer sample in accordance with the present invention.

The present invention will now be described with reference to the attached drawings, wherein like reference numerals are used to refer to like elements throughout. The invention provides methodologies for preparing and inspecting wafer samples by which measurements may be made of dimensions, thicknesses, and/or other physical characteristics of a semiconductor wafer at various stages of a manufacturing process flow.

One or more exemplary implementations of the invention are hereinafter illustrated and described in the context of wafer samples sectioned, etched, and inspected following dielectric etch process steps during interconnect processing of the wafers. However, it will be appreciated that the invention may be employed in association with inspections at any other point in a process flow, including but not limited to the illustrated interconnect processing, and that all such alternative implementations are contemplated as falling within the scope of the present invention and the appended claims. In addition, while the following description sets forth certain details of an exemplary implementation of the invention in which silicon nitride (SiN), carbon doped silicon dioxide (C-doped $SiO_2$) and silicon carbide (SiC) are employed for hard mask, dielectric, and etch-stop layer materials, respectively, the various aspects of the invention are applicable to delineating and/or differentiating layers of other materials, and that the appended claims are not limited to use in association with the illustrated wafer materials.

Referring initially to FIG. 1, an exemplary method 2 is illustrated for preparing and inspecting a semiconductor wafer during interconnect processing in accordance with the invention. While the exemplary method 2 is illustrated and described hereinafter as a series of acts or events, it will be appreciated that the present invention is not limited by the illustrated ordering of such acts or events, as some acts may occur in different orders and/or concurrently with other acts or events apart from those illustrated and/or described herein, in accordance with the invention. In addition, not all illustrated steps may be required to implement a methodology in accordance with the present invention. It is further noted that the methods according to the present invention may be implemented in association with the wafers and systems illustrated and described herein as well as in association with other systems and structures not illustrated.

Beginning at 4, the method 2 comprises forming an etch-stop layer at 6, for example, by depositing a layer of SiC to a thickness of about 1000 Å over an oxide layer and/or over previously formed conductive features (e.g., copper traces, silicide contacts, etc.) in the wafer, using any appropriate deposition process or processes as are generally known in the art. The etch-stop layer and subsequent layers formed at 8 and 10 below may be part of an initial interconnect layer or a subsequent ILD layer in a multi-level interconnect structure.

A dielectric layer is formed at 8 over the etch-stop layer and a hard mask layer is formed thereover at 10. The dielectric layer may be formed at 8 using any appropriate inter layer dielectric material having any desired thickness, such as C-doped $SiO_2$ deposited to a thickness of about 5000

Å, as in the exemplary devices illustrated and described below with respect to FIGS. 2–4. The overlying hard mask layer may be formed at 10 using any appropriate hard mask material, such as SiN deposited to a thickness of about 400 Å over the dielectric layer, wherein any known deposition techniques may be employed at 6, 8, and 10 in the method 2.

Once the etch-stop, dielectric, and hard mask layers have been formed at 6–10, a patterned resist mask is formed over the hard mask layer at 12, using any appropriate resist materials and photolithographic patterning techniques as are known, so as to provide a pattern to be used in forming trenches, vias, or other openings in the underlying hard mask, dielectric, and/or etch-stop layers. The openings formed by subsequent etching may be part of single-damascene, dual-damascene, or other type of interconnection processing methodologies in fabricating a single or multi-layer interconnect structure in the wafer.

A patterned hard mask etch is performed at 14 to selectively remove hard mask layer material and expose portions of the underlying dielectric layer, which employs the patterned resist as a mask. The patterned hard mask is then used in a patterned dielectric layer etch at 16 to form one or more cavities (e.g., vias, trenches, etc.) through the dielectric layer to expose portions of the underlying SiC etch-stop layer. Any appropriate etch techniques may be employed at 14 and 16 as are known, where the hard mask layer etch at 14 preferably removes the SiN hard mask layer material faster than the patterned resist material, and the dielectric layer etch at 16 preferably removes the C-doped $SiO_2$ dielectric layer material faster than the underlying SiC etch-stop layer material.

In order to measure the effectiveness of the dielectric layer etch at 16 (e.g., and/or the propriety of the materials and thickness employed in forming the material layers at 6–10), it is desirable to inspect the wafer at this point in the fabrication process flow. Accordingly, the wafer is sectioned at 18 following the dielectric etch step of 16. Any proper wafer sectioning techniques may be employed at 18, by which a sectioned, generally vertical side is exposed from the interior of the wafer, to provide access to a cross-section of the generally horizontal wafer layers of interest, and/or the interfaces therebetween.

In the present example of an interconnection process dielectric layer etch, it may be desired to determine whether and the extent to which the dielectric layer etch 16 exposed the SiC etch-stop layer material, and whether the etch at 16 over-etched the SiC to the point of exposing underlying conductive metal or oxide beneath the etch-stop layer. This information may then be used to determine or adjust one or more process variables associated with the etch at 16 (e.g., etch time, etch selectivity/chemistry, etc.), or parameters associated with the formation of one or more interconnect layers (e.g., the etch-stop layer thickness). For example, in order to improve device performance, it may be desirable to minimize the etch-stop layer thickness. Also, it may be desirable to reduce process time associated with the etch step at 16, as well as the deposition time of the etch-stop layer formation step at 6, in order to increase manufacturing throughput.

Improving the accuracy of measurements related to the physical characteristics of the wafer section following the etch-stop layer etch at 16 facilitates such process optimization efforts. In this regard, it will be appreciated that accurate inspection of sectioned wafer samples facilitates efforts to optimize other processing steps apart from those illustrated in the present example. In the exemplary case of sample wafers sectioned following the dielectric layer etch at 16, the inventors have found that conventional sample preparation techniques are largely inadequate for delineation of the hard mask, dielectric, and etch-stop layers and the interfaces therebetween.

In particular, as the materials used in forming these layers are refined to reduce the dielectric constants thereof, the materials, although different, are more similar in composition than was the case in the past. It is believed that the increased similarity in material composition of the etch-stop layer material (e.g., SiC) and the low-k dielectric layer material (e.g., C-doped $SiO_2$) has rendered conventional SO wet etch staining largely ineffective for preparing such samples for inspection, as illustrated and described further below with respect to FIGS. 3A and 3B. Thus, the inventors have found that SO staining techniques do not provide sufficient delineation of the layers and the intervening interfaces to allow proper interpretation when the sample is subsequently inspected, particularly in cases where the material layer compositions are similar and as device feature sizes and layer thicknesses are decreased.

In accordance with an aspect of the invention, therefore, the sample wafer sectioned at 18 is then anisotropically etched at 20, using a reactive ion etching (RIE) process generally perpendicular to the sectioned surface of interest. Any generally anisotropic etch process may be used to prepare the sectioned sample for inspection, including but not limited to RIE etch techniques, within the scope of the invention. Thereafter, the etched sectioned surface of interest is inspected at 22 using any known metrology tools, such as a scanning electron microscope (SEM) before the exemplary method 2 ends at 24.

In the illustrated implementation illustrated and described herein, where delineation is sought between a C-doped $SiO_2$ low-k dielectric layer, an overlying SiN hard mask layer, and an underlying SiC etch-stop layer, the reactive ion etching at 20 may be implemented using $CF_4$, $O_2$, and $CHF_3$ gases, although any appropriate etch chemistry may be employed to anisotropically etch the sample within the scope of the invention. In this regard, the RIE etch at 20 may comprise providing $CF_4$ gas at a flow rate between about 3.5 and 6.5 sccm, such as about 5 sccm, providing $O_2$ gas between about 2 and 4 sccm, such as about 3 sccm, and providing $CHF_3$ gas at a flow rate between about 28 and 52 sccm, such as about 40 sccm.

The RIE process is preferably performed by providing a first RF power of about 300 watts to a first electrode spaced from the sectioned surface in an etching chamber, and providing a second RF power of about 75 watts to a second electrode proximate the sectioned surface. In this example, the etching process material is provided in a direction generally perpendicular to the sectioned surface for about 2 to 4 seconds, preferably about 3 seconds. During the exemplary etch process at 20, moreover, the chamber pressure is set to about 35 to 65 mTorr, preferably about 50 mTorr.

As illustrated and described further below with respect to FIGS. 4A and 4B, the exemplary RIE etch at 20 provides significantly improved layer and interface delineation, particularly compared with the conventional SO staining techniques (e.g., FIGS. 3A and 3B, below). Following the RIE surface preparation etching, the wafer is then inspected by scanning using a scanning electron microscope. While not wishing to be bound by any particular theory, it is believed that in this example, the $CF_4$ and the $CHF_3$ etch silicon oxide SiO, and the $O_2$ in the RIE process 20 etches the low-k C-doped $SiO_2$ in preferential fashion, resulting in improved etch selectivity between the layer materials. This has been found to improve the ability of subsequent SEM scanning at 22 to ascertain or identify the interface between the C-Doped $SiO_2$ dielectric layer and the SiC etch-stop layer, as well as the interface between the etch-stop layer and underlying material, such as oxide SiO and/or conductive features used in the interconnect processing.

In addition, it is believed that the anisotropic nature of the exemplary RIE process at 20 avoids or mitigates interface blurring previously attributed to the isotropic nature of SO staining and other wet,etch processes. This facilitates accurate identification of interface positioning, layer thicknesses, etch process penetrations, etc., particularly as layer thicknesses, etch cavities, and other features continue to be reduced in the manufacture of high density integrated circuit devices. Thus, the exemplary RIE process at 20 provides both these aspects of the invention in the illustrated implementation wherein SiC etch-stop materials and low-k dielectric layer materials are used. It will be appreciated that the etch chemistries illustrated and described herein are exemplary in nature, and that the invention is not limited to the illustrated implementations. Thus, for example, etch chemistries, including the types and ratios of various etch process gasses may be adjusted or selected to achieve appropriate etch selectivities between any particular layers of interest in a semiconductor wafer, within the scope of the invention.

In the illustrated implementation, the improved delineation by the RIE etch at 20, in turn, facilitates informed assessment of the penetration of the dielectric etch at 16 into (e.g., and potentially through) the SiC etch-stop material. Based on the inspection at 22, then, the process parameters may be adjusted in order to improve device performance or reliability, and/or to improve the process throughput. For example, the dielectric etch at 16 may be found to controllably expose the etch-stop material to complete the formation of trenches and/or vias in the low-k dielectric within allowable process margins. In that case, the thickness of the etch-stop layer material (e.g., deposited at 6) may be reduced or minimized to improve (e.g., reduce) the dielectric constant of the combined dielectric and etch-stop layers. This, in turn, may also shorten the processing time required for etch-stop layer deposition at 6, thereby also improving process throughput.

Alternatively or in combination, where inspection at 22 correctly identifies that the dielectric etch at 16 penetrates most or all of the etch-stop layer material, the etch process at 16 may be shortened, thereby improving process throughput. Many other process refinements are facilitated by the employment of the present invention, including those associated with the interconnect trench/via formation discussed herein, as well as those associated with other manufacturing process steps, as will be apparent to those of ordinary skill in the art. In this regard, the invention finds utility at virtually any point in a semiconductor device manufacturing process flow and is not limited to the specific examples illustrated and described herein.

Figure 2A:
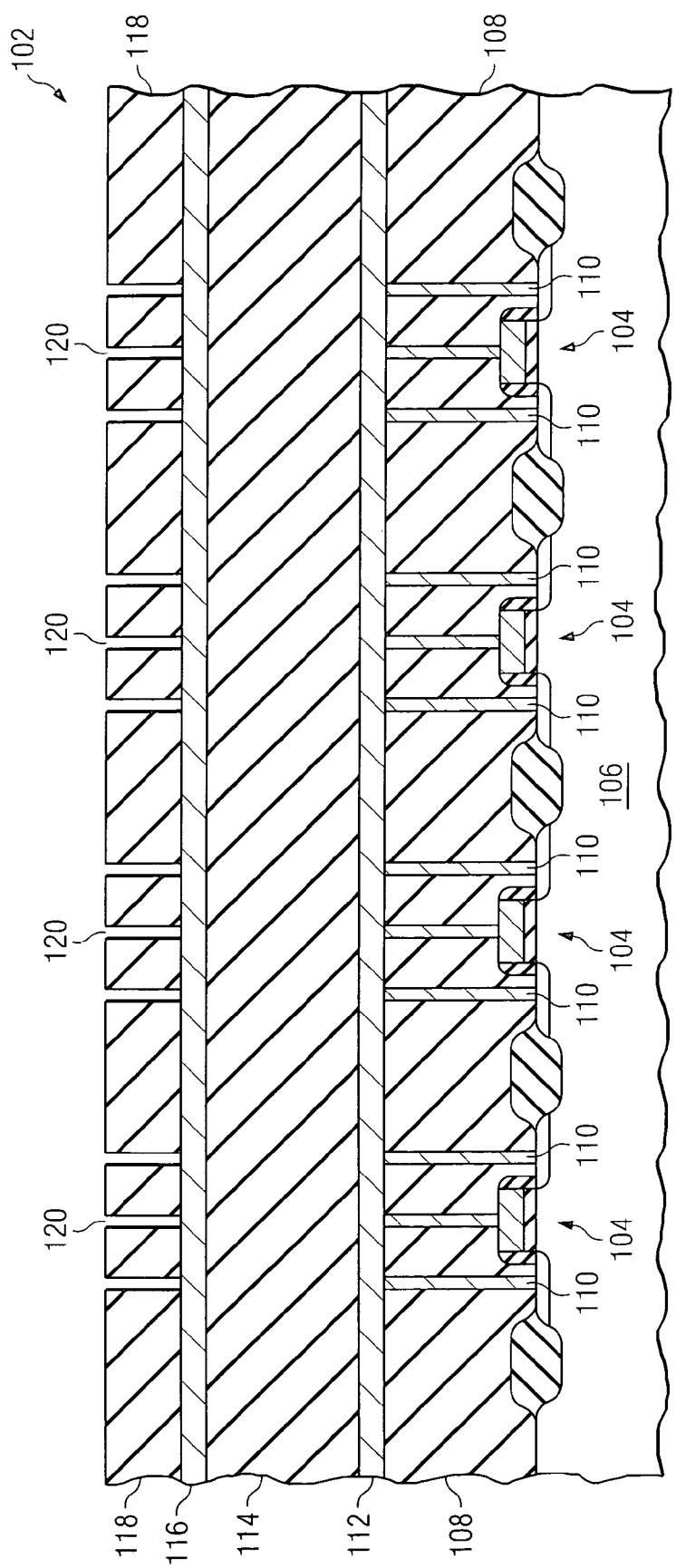
FIG. 2A is a partial side elevation view in section illustrating a portion of a semiconductor wafer with a patterned resist mask formed over hard mask, interlayer dielectric, and etch-stop layers at an intermediate stage of interconnect processing in a manufacturing process flow.

Referring also to FIGS. 2A–2I, an exemplary semiconductor device wafer 102 is illustrated undergoing processing generally in accordance with the method 2. The wafer 102 is illustrated in FIG. 2A at an intermediate stage of fabrication, wherein MOS type transistor devices 104 have been formed in a semiconductor substrate 106, wherein it is noted that the structures illustrated in the figures are not necessarily drawn to scale. A first inter layer dielectric layer 108 is formed over the substrate 106 and the transistors 104, wherein silicide contacts (not shown) have been previously formed for electrical connection of the gates, and source/drain regions of the devices 104. Conductive contact structures 110 are formed through the dielectric layer 108 to electrically connect the electrical terminals of the transistors 104 with other components in the device through construction of an overlying multi-level interconnect structure.

An etch-stop layer 112 is formed over the layer 108 and the contacts 110 (e.g., step 6 of method 2 in FIG. 1 above) using SiC material, and a low-k dielectric layer 114 is formed by deposition of C-doped $SiO_2$ over the SiC etch-stop layer 112 (e.g., step 8 of method 2). The layer 114 will subsequently by etched and portions thereof will be filled with an initial metal layer (e.g., metal layer 1 in a multi-layer interconnect processing). In the present example, openings or trenches will be etched in the dielectric layer 114 as part of a damascene interconnect process flow, to be ultimately filled with conductive metal material, such as copper. In this case, further levels may subsequently be fabricated in order to provide the desired interconnection in fabricating an integrated circuit design. However, it will be appreciated that the aspects of the invention illustrated herein may be employed in other interconnect process flows apart from the illustrated examples. A hard mask layer 116 of SiN is formed (e.g., step 10 of method 2) over the low-k dielectric layer 114, and a patterned resist mask 118 is formed over the hard mask layer 116 (e.g., step 12 of method 2), leaving portions of the hard mask layer 116 exposed in prospective trench regions 120, as illustrated in FIG. 2A.

Figure 2B:
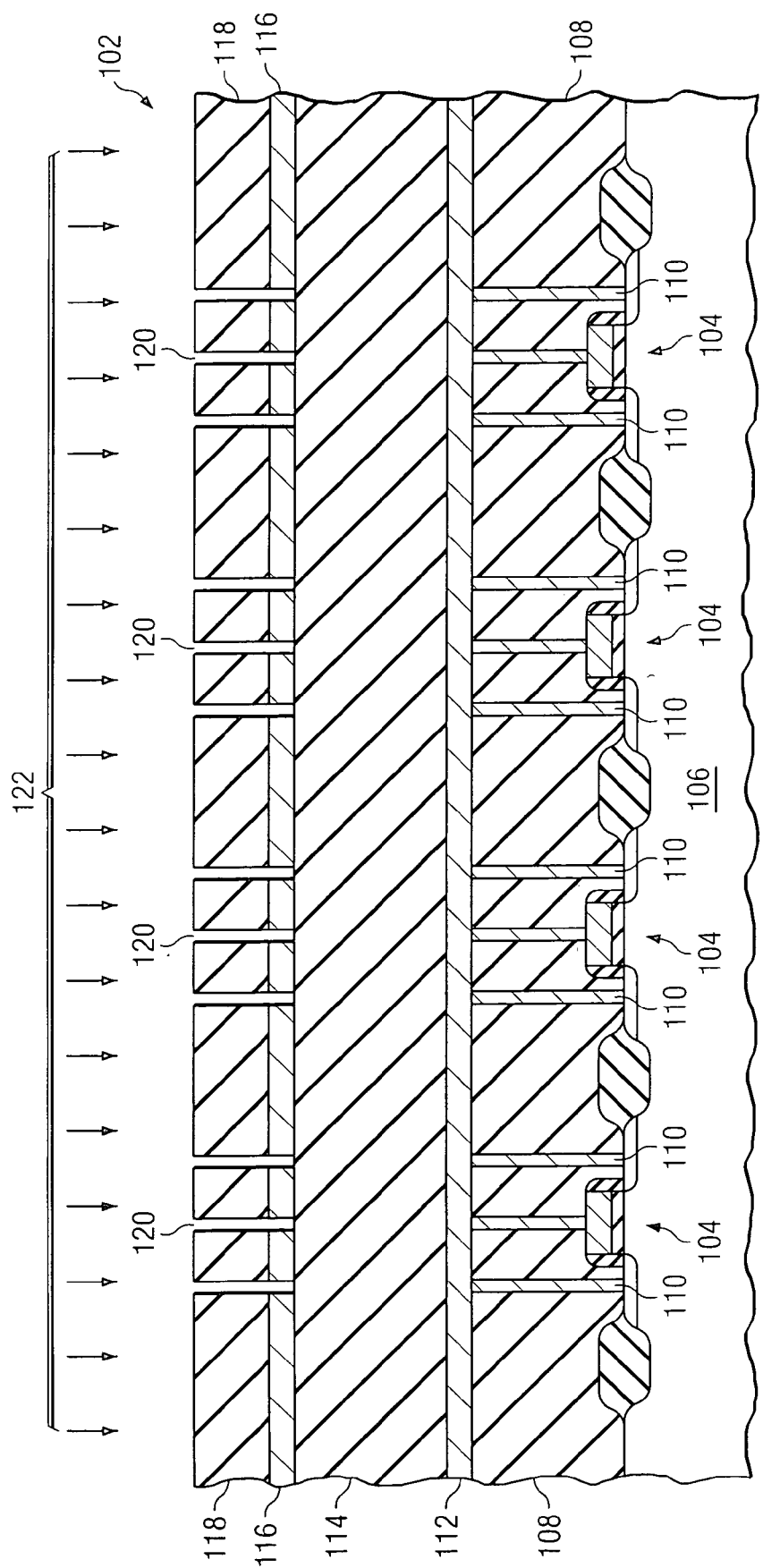
FIG. 2B is a partial side elevation view in section illustrating the wafer of FIG. 2A undergoing a patterned hard mask layer etch process.
Figure 2C:
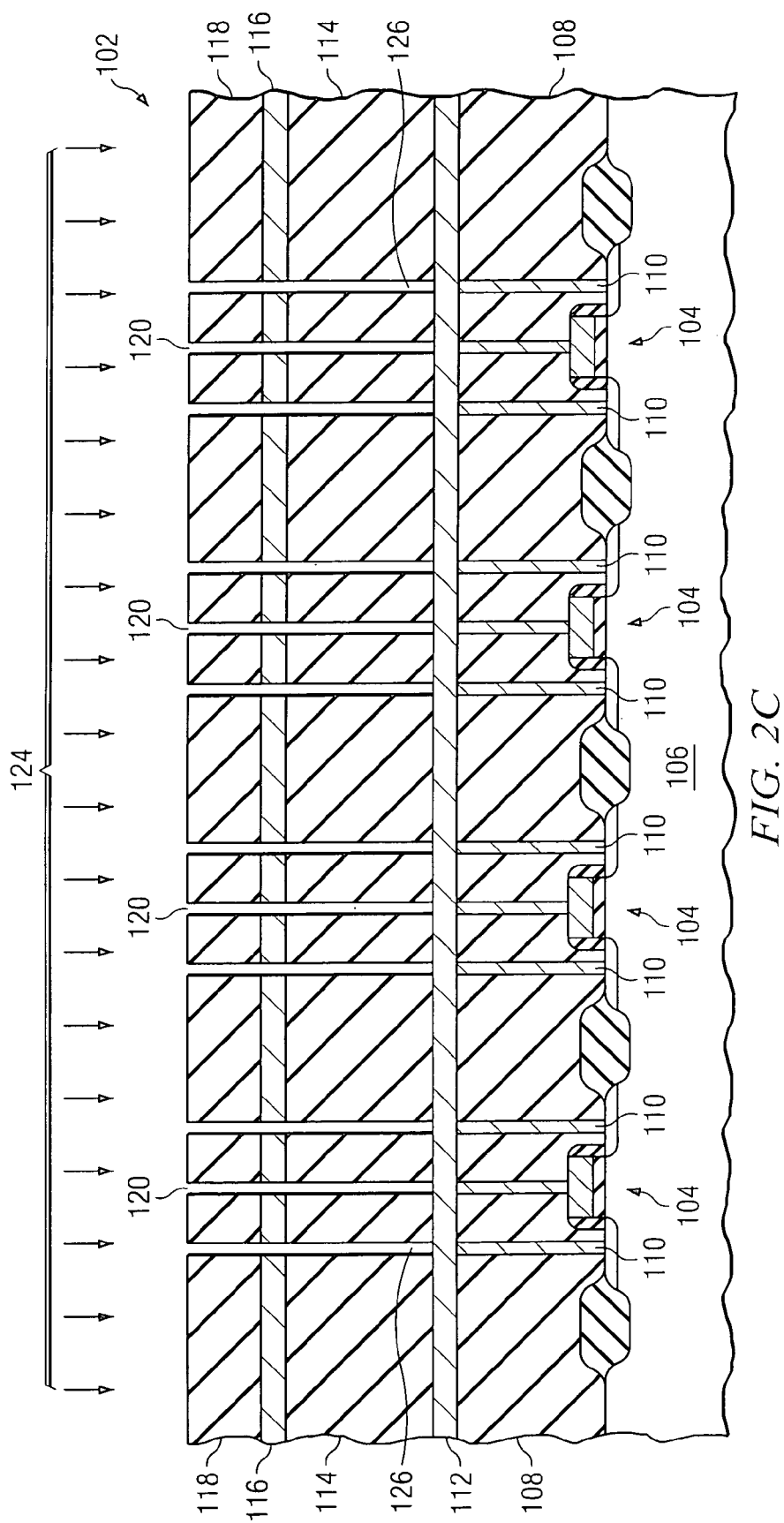
FIG. 2C is a partial side elevation view in section illustrating the wafer of FIGS. 2A and 2B undergoing a patterned dielectric layer etch process.

In FIG. 2B, a patterned hard mask layer etch process 122 is performed (e.g., step 14 of method 2) to selectively remove material from the hard mask layer 116 in the trench regions 120, and to expose portions of the underlying dielectric layer 114 thereat. The remaining resist 118 may be removed, or may remain during a subsequent patterned dielectric layer etch 124 in FIG. 2C (e.g., step 16 of method 2), which forms cavities or openings 126 (e.g., trenches) through the dielectric layer 114 and which ideally exposes portions of the underlying SiC etch-stop layer 112 in the trench cavities 126. In the illustrated flow, an etch-stop layer etch (not shown) may thereafter be performed, after which the trenches 126 are filled with metal material (e.g., copper, not shown), and the wafer is planarized. In the current example, however, the wafer 102 is removed from the interconnect process flow following the dielectric layer etch process 122 for sectioning and inspection in accordance with the invention.

Figure 2D:
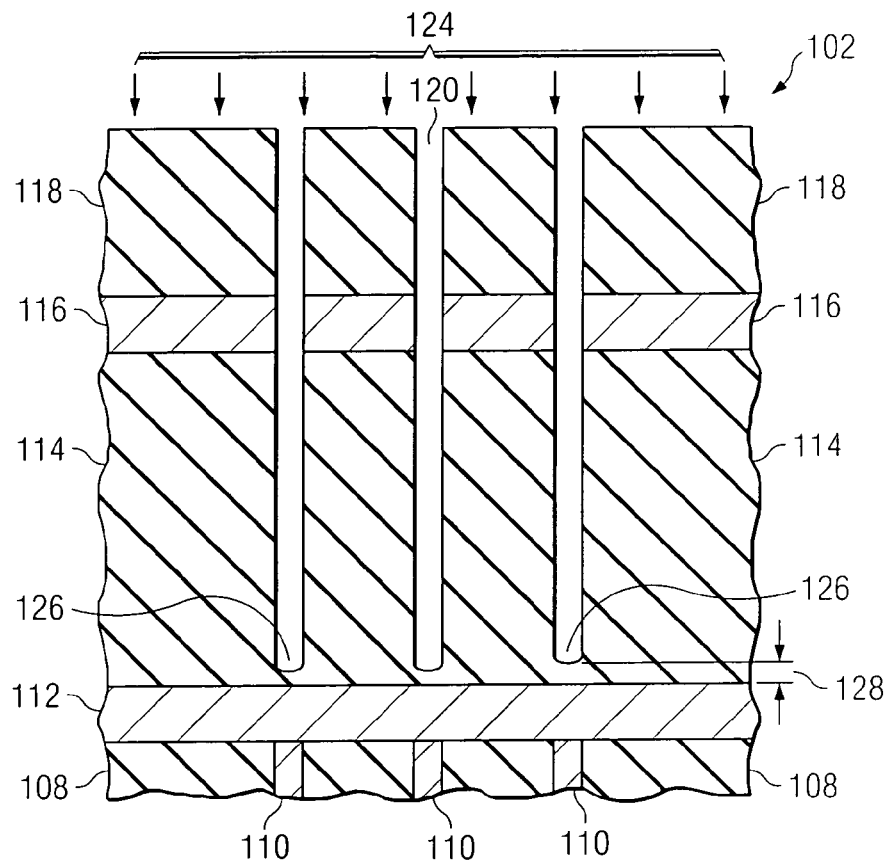
FIG. 2D is a partial side elevation view in section illustrating the wafer of FIGS. 2A–2C at an intermediate point in the dielectric layer etch process prior to exposure of the etch-stop layer.
Figure 2E:
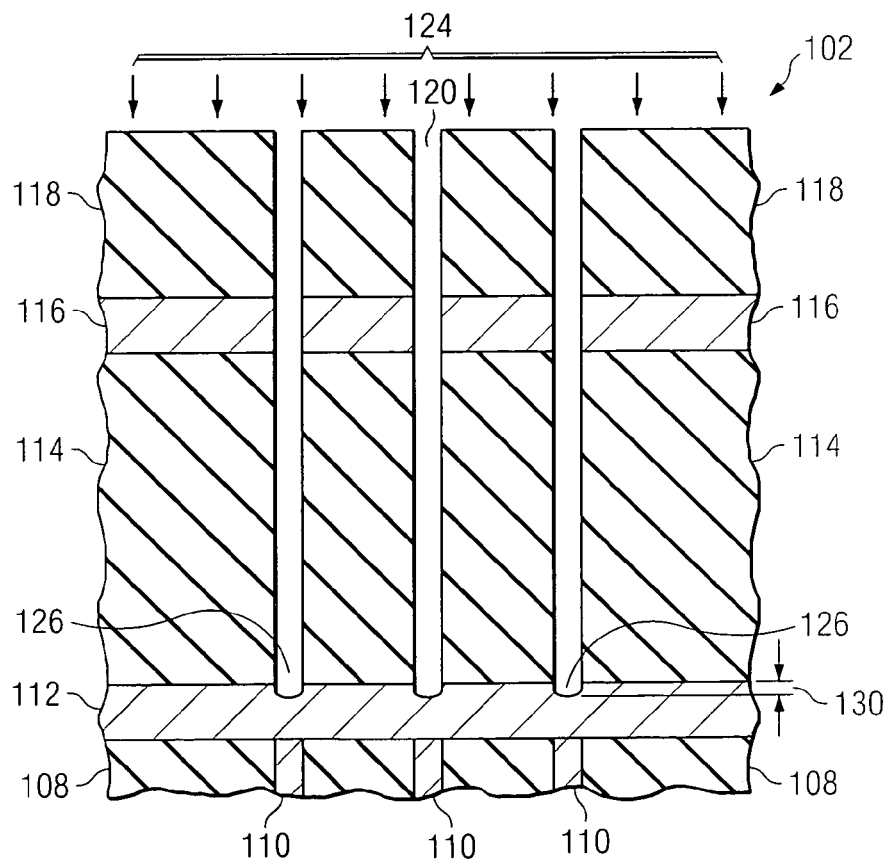
FIG. 2E is a partial side elevation view in section illustrating the wafer of FIGS. 2A–2D at a subsequent point in the dielectric layer etch process whereat the etch-stop layer is exposed.

FIGS. 2D and 2E illustrate further details of the dielectric layer etch 124, wherein FIG. 2D shows a point in the process 124 at which the majority of the dielectric material has been removed in the trench 126, but the underlying etch-stop layer 112 has not yet been exposed. Were the process stopped at this point, an under etch distance 128 would remain unetched. Inspection following the process 124 (e.g., via sectioning, RIE preparation etching, and SEM inspection per steps 18–22 of method 2) may be used to successfully identify the depth of the trenches 126 to verify the propriety of the etch process 124. In addition, the inspection may be used to determine the interface between the C-doped $SiO_2$ dielectric layer 114 and the etch-stop layer 112, as well as the interface between the etch-stop layer 112 and the underlying dielectric layer 108, along with the etch-stop layer thickness. With this information, it can be determined that the dielectric layer etch process 124 of FIG. 2D needs to be continued for a longer time (e.g., and/or that faster etch rate etch chemistries should be employed, or other process refinements are in order).

Another situation is illustrated in FIG. 2E, in which the dielectric layer etch process 124 is stopped after exposing portions of the etch-stop layer 112 in the trench cavities 126 but before penetration to the underlying contacts 110. Using the inspection preparation techniques of the present invention, the degree to which the etch 124 penetrates the etch-stop layer 112 can be identified as a penetration depth 130. For instance, if the dielectric etch 124 is found to controllably expose the etch-stop layer 112 within allowable process margins, the thickness of the etch-stop layer material 112 may be reduced or minimized. Alternatively, if the dielectric etch 124 penetrates most or all of the etch-stop layer material and into the contacts 110, the etch process at 16 may need to be shortened. It will be noted at this point that the various aspects of the invention may be applied in association with other interconnect processes, such as dielectric layer etching during via formation, and at any other point in the fabrication of semiconductor devices, including but not limited to the illustrated process flow.

Figure 2F:
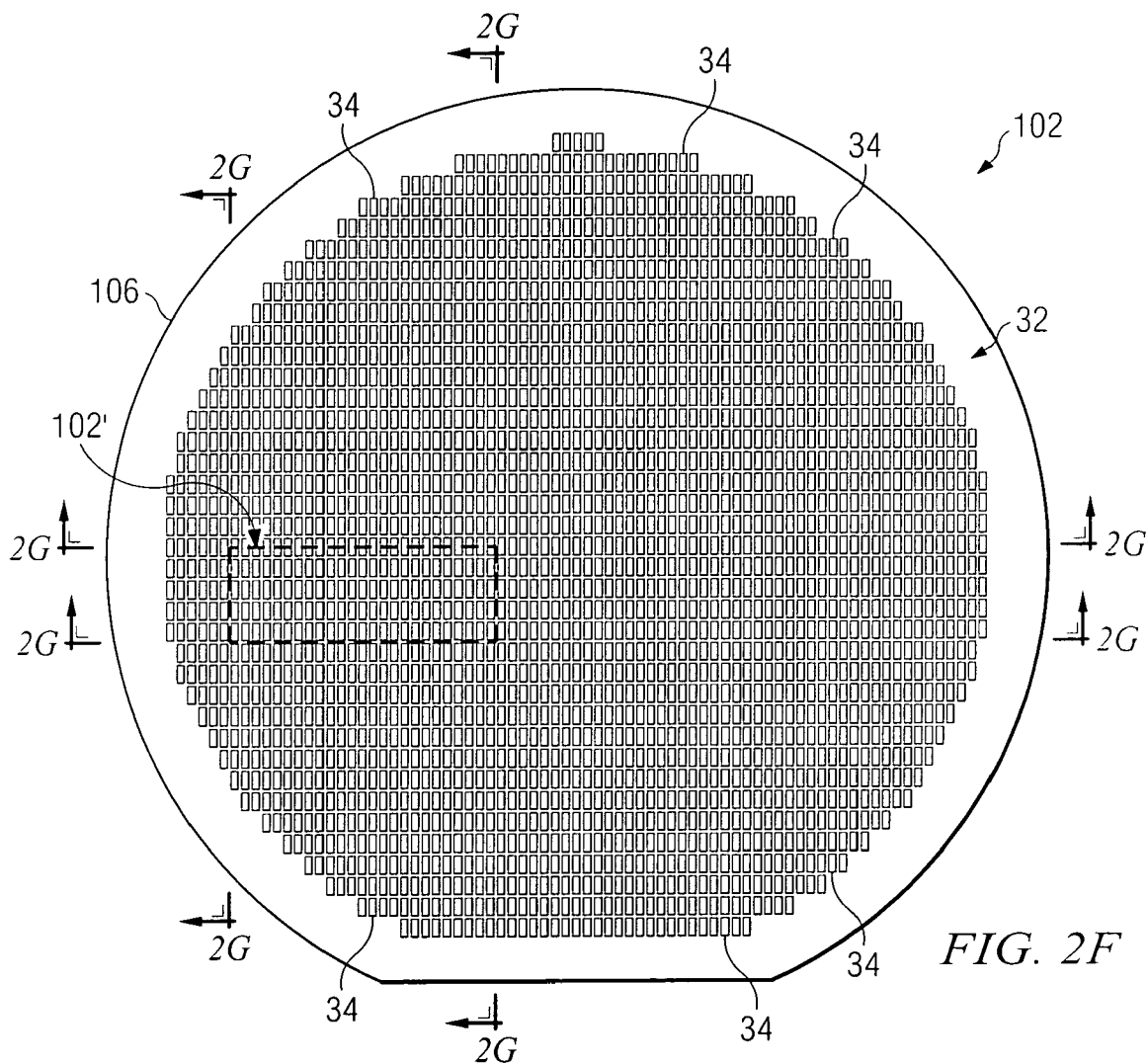
FIG. 2F is a top plan view illustrating sectioning of the wafer of FIGS. 2A–2E following the dielectric layer etch process for inspection of the hard mask, interlayer dielectric, and etch-stop layers.
Figure 2G:
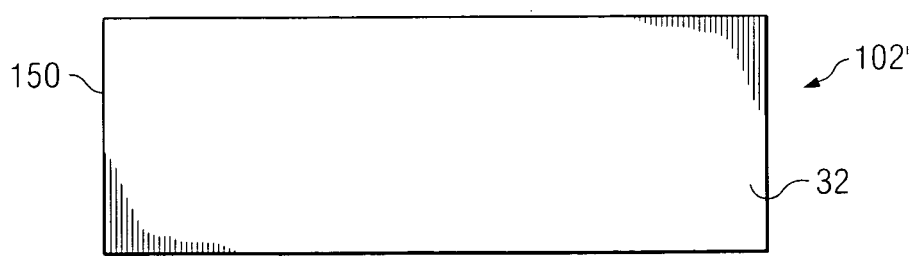
FIG. 2G is a top plan view illustrating a sectioned portion of the wafer of FIGS. 2A–2F and an exposed vertical side surface thereof to be prepared according to the invention for subsequent inspection.

FIGS. 2F and 2G illustrate an exemplary sectioning of the etched wafer 102 (e.g., step 18 of method 2), wherein the wafer 102 includes the substrate 106 with a plurality of die areas 34 located in rows and columns in a top side 32 of the wafer 102. The die areas 34 are illustrated having generally rectangular boundaries within which individual electrical components and circuits are formed on the top side 32 and within the wafer 102. Channels are saw cut along lines 2G—2G of FIG. 2F, and a sectioned portion 102' of the wafer 102 is separated for preparation and inspection in accordance with the aspects of the invention, as shown in FIG. 2G. Any appropriate separation techniques may be employed (e.g., at step 18 of the method 2) to expose a generally vertical side surface 150 or cross-section of interest, including techniques employed in die singulation or others.

Figure 2H:
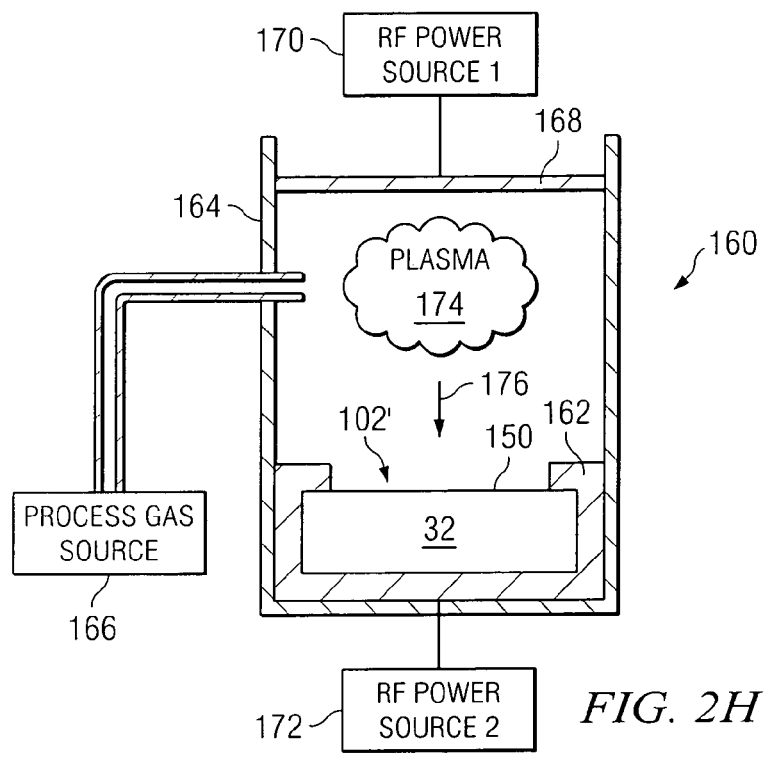
FIG. 2H is a simplified side elevation view in section illustrating an exemplary RIE etching chamber in which the wafer portion of FIG. 2G is being subjected to an anisotropic etch perpendicular to the vertical side surface in accordance with the invention.

Referring also to FIG. 2H, once the sectioned portion 102' is separated from the wafer 102, the portion 102' is prepared for inspection by anisotropic etching of the exposed sectioned surface 150 of interest. In the above example, the surface 150 is a generally vertical side section exposing the hard mask, dielectric, and etch-stop layers 116, 114, and 112, respectively of the wafer following the patterned dielectric etch process 124. FIG. 2H illustrates an exemplary RIE etching chamber 160 in which one or more aspects of the invention (e.g., anisotropic etching of step 20 in FIG. 1) may be carried out in preparing the sample portion 102' for SEM inspection. The sectioned sample portion 102' is mounted in a vise clamp 162 or other sample mounting apparatus in a sealed enclosure 164 to which one or more etch process gasses 166 are provided during etching (e.g., $CF_4$, $O_2$, and $CHF_3$ gases in the illustrated implementation).

The chamber 160 includes a first or upper electrode 168 connected to a first RF power source 170. A second or lower electrode is connected to the vise wafer holder 162, and receives RF power from a second RF power source 172. The application of first and second RF power from the sources 170 and 172, respectively, generates a plasma 174 in the enclosure, from which ions are imparted in a direction 176 generally perpendicular to the sectioned surface 150 to be inspected. This RIE etch provides one implementation of anisotropic material removal, although any isotropic etch process and apparatus may be employed within the scope of the invention. Thereafter, the sample portion 102' is removed from the enclosure 164 for SEM or other type inspection. The chamber 160 is thus adapted to performed the above described RIE sample preparation etch process, as well as other preparation etches in accordance with the present invention. For example, other RIE etches may be performed within the scope of the invention, wherein the power levels of the sources 170, 172, and/or the types and ratios of the process gases 166 may be varied according to the particular material layers of interest in the sectioned sample 32, so as to provide delineation thereof for use in process analysis.

Figure 2I:
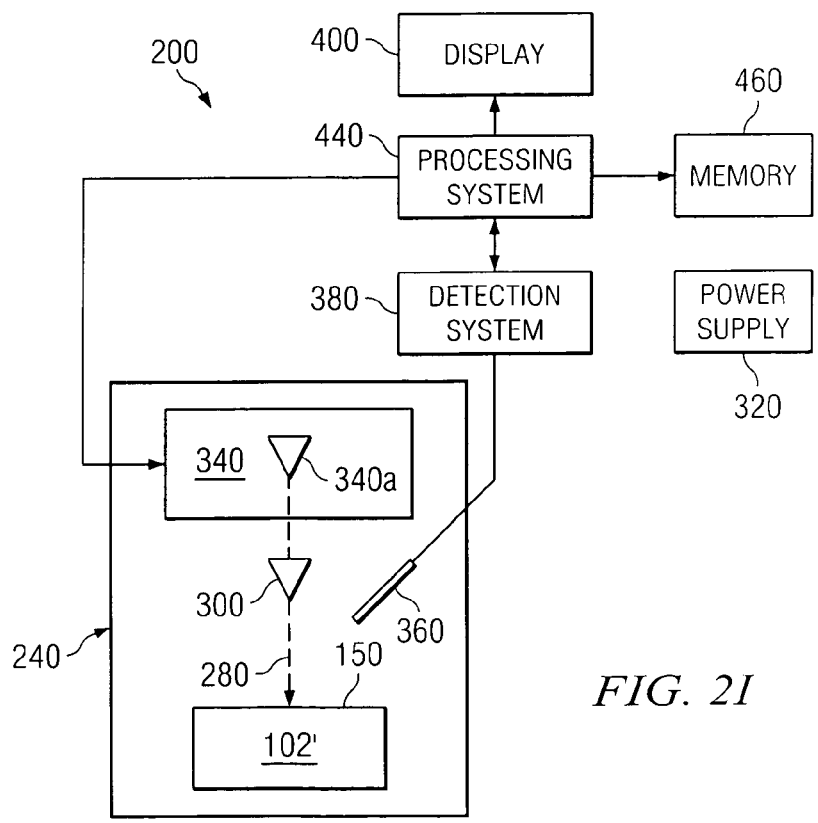
FIG. 2I is a simplified schematic diagram illustrating an exemplary scanning electron microscope system in which the sample wafer portion of FIGS. 2G and 2H is being inspected following RIE etching.

FIG. 2I illustrates an exemplary SEM system 200 comprising an SEM chamber 240 for housing the sample portion 102' during inspection. An electron beam 280 is created from a high voltage supplied by a power supply 320 associated with a beam generating system 340, which includes an emission element 340a. Various directing, focusing, and scanning elements (not shown) in the beam generating system 340 guide the electron beam 280 from the emission element 340a to an electromagnetic lens 300. The beam 280 is then directed from the lens 300 toward the sample portion 102'. As the electron beam 280 strikes the surface 150 of the portion 102', secondary electrons and x-rays are emitted which are detected by a detector 360 and are provided to a detection system 380.

The detection system 380 provides digitized detector signals to a processing system 440 for performing conventional critical dimension measurements and signal analysis, by which an image of the scanned surface of interest 150 may be generated. The image may then be directed to a display 400 by the processing system 440. The processing system 440, in addition to analyzing data received by the detection system 380, synchronizes the scanning of the display 400 with electron beam scanning of the sample portion 102' to provide the image. Contrast of the displayed image is related to variations in the flux of electrons arriving at the detector 360 and is related to the yield of emitted electrons from the surface 150 of the sample portion 102' to the incident electrons from the electron beam 280.

The detection system 380 receives the electron emissions from the sample 102' via the detector 360 and preferably digitizes the information for the processing system 440. The processing system 440 provides critical dimension information to the display 400 and/or stores information in a memory 460. A processor (not shown) is included in the processing system 440 for controlling the beam generating system 340, providing critical dimension measurements, and for performing signal analysis. The processor in the processing system 440 is programmed to control and operate the various components within the SEM system 200 in order to carry out various inspection and display functions.

The memory 460 is operatively coupled to the processing system 440 and serves to store program code executed by the processor for carrying out operating functions of the system 200, and serves as a storage medium for temporarily storing information such as critical dimension data or other data. The power supply 320 also provides operating power to the SEM system 200 along with providing a high voltage to the beam generating system 340. Any suitable power supply (e.g., linear, switching) may be employed to carry out the present invention.

Figure 3A:
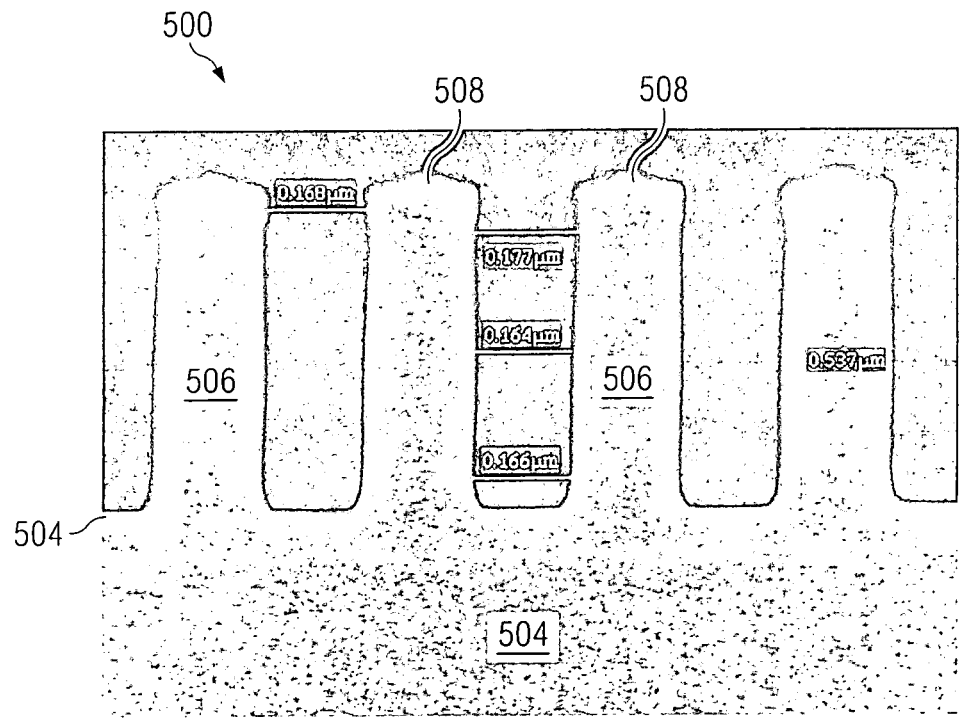
FIG. 3A is a partial cross-sectional SEM side image illustrating a high density interior portion of an exemplary sectioned sample wafer having a silicon carbide etch-stop layer underlying a carbon doped silicon dioxide dielectric layer and an overlying silicon nitride hard mask layer following a patterned dielectric layer etch process and conventional SO staining.

Referring now to FIGS. 3A–4B, actual SEM images are provided to illustrate the improved inspection results which may be obtained through application of one or more aspects of the invention. FIGS. 3A and 3B are partial cross-sectional SEM side images illustrating a high density interior and low density edge portions, respectively, of an exemplary sectioned sample wafer 500 following dielectric layer etching. The wafer 500 comprises a SiC etch-stop layer 502 formed over an oxide layer or conductive feature 504, wherein the etch-stop layer 502 underlies a C-doped $SiO_2$ low-k dielectric layer 506. In addition, a SiN hard mask layer 508 overlies the dielectric layer 506, wherein portions of the dielectric layer 506 have been removed to form cavities therein as part of an interconnect process. The wafer 500 has also been sectioned and prepared using conventional SO wet etch staining. As can be seen from FIGS. 3A and 3B, the SO staining technique provides limited delineation of the layers 502–508 and the interfaces therebetween.

Figure 3B:
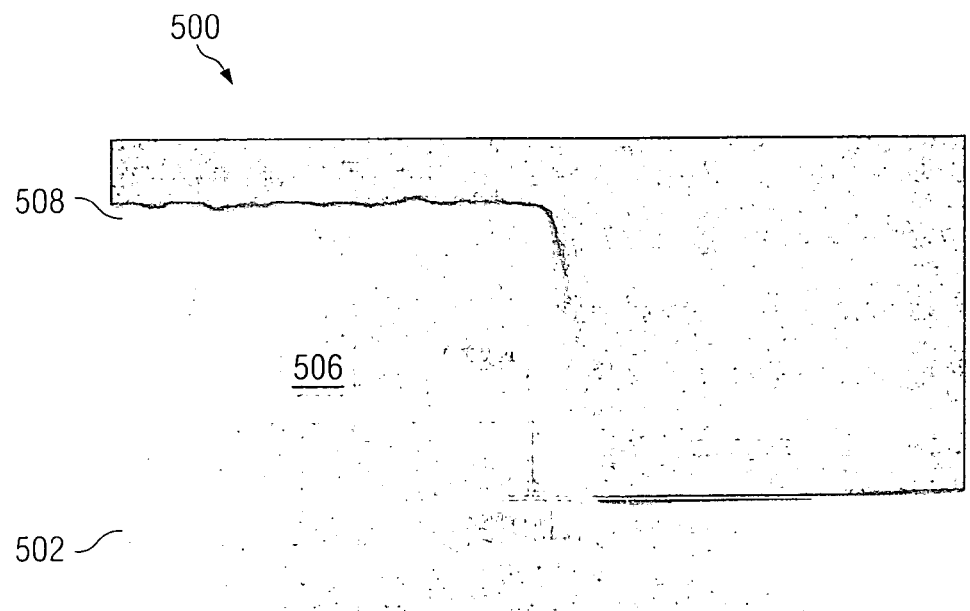
FIG. 3B is a partial cross-sectional SEM side image illustrating a low density edge portion of the hard mask, dielectric, and etch-stop layers in the sample wafer of FIG. 3A following the patterned dielectric layer etch process and SO staining.
Figure 4A:
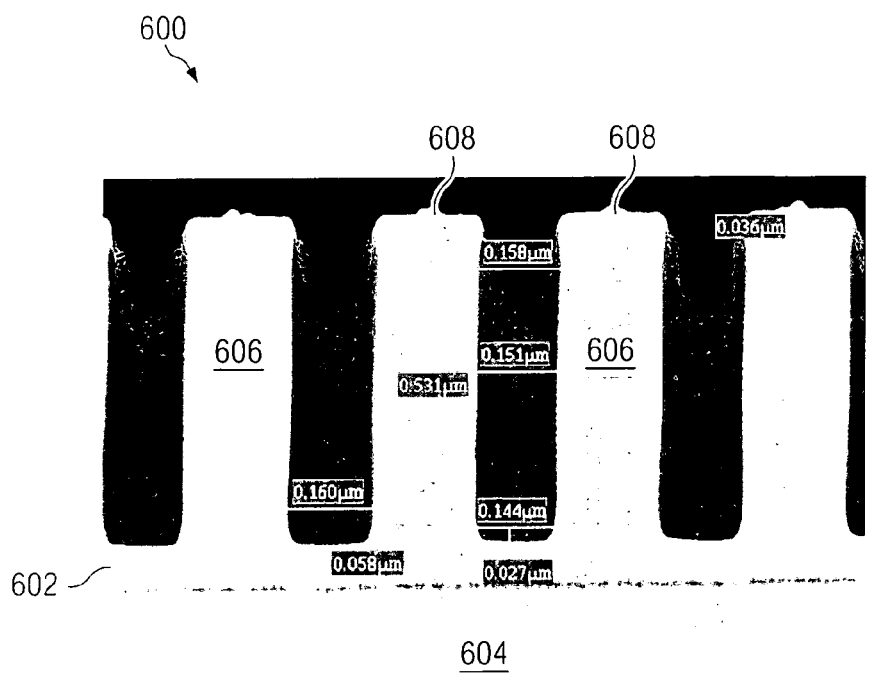
FIG. 4A is a partial cross-sectional SEM side image illustrating a high density interior portion of another exemplary sectioned sample wafer having a silicon carbide etch-stop layer underlying a carbon doped silicon dioxide dielectric layer and an overlying silicon nitride hard mask layer following a patterned dielectric layer etch process and anisotropic etching in accordance with the present invention.
Figure 4B:
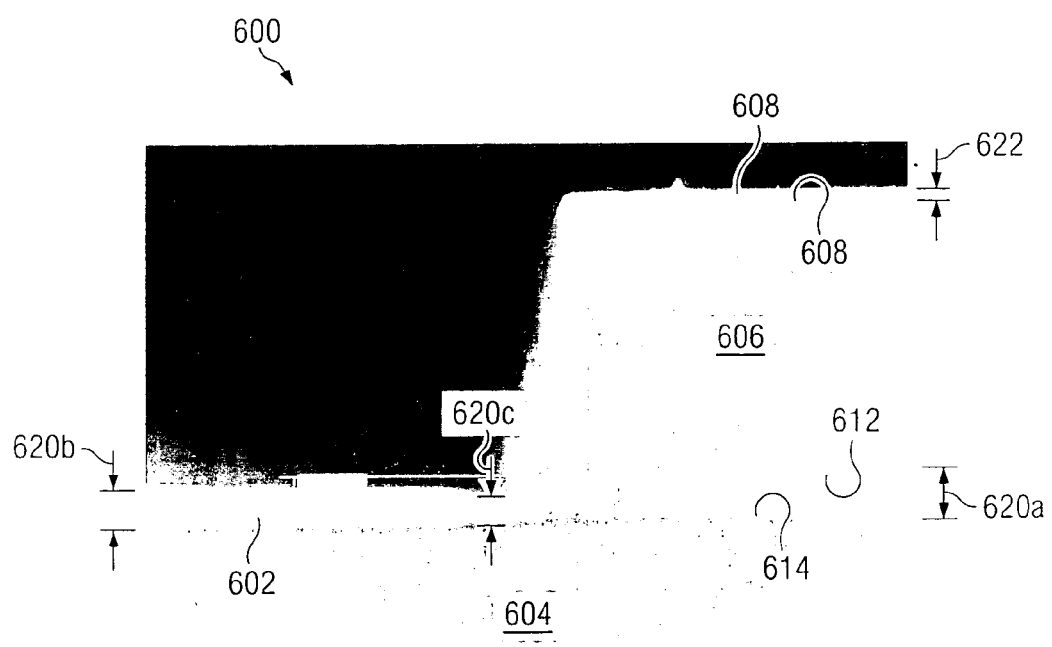
FIG. 4B is a partial cross-sectional SEM side image illustrating a low density edge portion of the hard mask, dielectric, and etch-stop layers in the sample wafer of FIG. 4A following the patterned dielectric layer etch process and anisotropic etching of the invention.

FIGS. 4A and 4B provide partial cross-sectional SEM side images respectively, of high density interior and low density edge portions of another sectioned wafer 600 following dielectric layer etching. The wafer 600 comprises a SiC etch-stop layer 602 formed over an oxide layer or conductive feature 604, wherein the etch-stop layer 602 underlies a C-doped $SiO_2$ low-k dielectric layer 606, with a SiN hard mask layer 608 overlying the dielectric layer 606. Unlike the wafer 500 of FIGS. 3A and 3B, the wafer 600 has been anisotropically etched following dielectric layer etching and sampling, in accordance with the invention. In particular, the exemplary wafer 600 has been prepared for inspection by RIE etching using $CF_4$, $O_2$, and $CHF_3$ gases in a process generally perpendicular to the illustrated sectioned surface (e.g., in a direction generally into the page of FIGS. 4A and 4B).

As can be seen from FIGS. 4A and 4B, the anisotropic sample preparation etch provides significantly improved delineation of the layers 602–608 compared with the SO stain of FIGS. 3A and 3B. In particular, the edges of the layers 602–608 can be clearly ascertained in both the interior (FIG. 4A) and peripheral (FIG. 4B) portions of the wafer 600. In this regard, identification of an interface 610 between the hard mask layer 608 and the underlying dielectric layer 606 can be easily identified, along with the interface 612 between the dielectric layer 606 and the underlying etch-stop layer 602. Additionally, the interface 614 between the etch-stop layer and the underlying oxide layer 604 can be identified.

Layer thicknesses may also be easily measured at various places in the wafer 600, due to the improved delineation provided by the invention. For example, the initial etch-stop layer thickness 620a can easily be ascertained (e.g., about 840 Å in FIG. 4B), as well as final (e.g., post dielectric etch) thicknesses 620b and 620c at different locations. Moreover, the post-etch thickness 622 of the hard mask layer 608 can easily be measured using SEM or other inspection instruments. It will be appreciated that the improved layer delineation of the invention may be employed in a variety of inspection and analysis situation in the manufacture of semiconductor device products, and that the illustrated implementations are merely exemplary in nature.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and/or the claims, such terms are intended to be inclusive in a manner similar to the term "comprising."

What is claimed is:

1. A method of inspecting a semiconductor wafer, comprising:
   sectioning the wafer to expose a sectioned surface of interest:
   etching the exposed sectioned surface using an anisotropic etch process; and
   inspecting the etched sectioned surface,
   wherein etching the exposed sectioned surface comprises performing a reactive ion etch process on the sectioned surface,
   wherein the reactive ion etch process comprises $CF_4$, $O_2$, and $CHF_3$ gases, and
   wherein the reactive ion etch process comprises providing the $CF_4$ gas at a flow rate of about 3.5 sccm or more and about 6.5 sccm or less, the $O_2$ gas at a flow rate of about 2 sccm or more and about 4 sccm or less, and the $CHF_3$ gas at a flow rate of about 28 sccm or more and about 52 sccm or less.

2. The method of claim 1, wherein the reactive ion etch process comprises providing the $CF_4$ gas at a flow rate of about 5 sccm, the $O_2$ gas at a flow rate of about 3 sccm, and the $CHF_3$ gas at a flow rate of about 40 sccm.

3. The method of claim 1, wherein the reactive ion etch process comprises applying a first RF power of about 300 watts to a first electrode spaced from the sectioned surface in an etching chamber and applying a second RF power of about 75 watts to a second electrode proximate the sectioned surface in the chamber while etching the exposed sectioned surface.

4. The method of claim 1, wherein inspecting the etched sectioned surface comprises scanning the etched sectioned surface using a scanning electron microscope.

5. The method of claim 1, wherein the reactive ion etch process comprises etching the exposed sectioned surface at a pressure of about 35 mTorr or more and about 65 mTorr or less.

6. The method of claim 5, wherein the reactive ion etch process comprises etching the exposed sectioned surface at a pressure of about 50 mTorr.

7. A method of inspecting a semiconductor wafer, comprising:
   sectioning the wafer to expose a sectioned surface of interest;
   etching the exposed sectioned surface using an anisotropic etch process; and
   inspecting the etched sectioned surface,
   wherein etching the exposed sectioned surface comprises performing a reactive ion etch process on the sectioned surface,
   wherein the reactive ion etch process comprises $CF_4$, $O_2$, and $CHF_3$ gases, and
   wherein etching the exposed sectioned surface comprises performing the reactive ion etch process on the sectioned surface for about 2 seconds or more and about 4 seconds or less.

8. The method of claim 7, wherein etching the exposed sectioned surface comprises performing the reactive ion etch process substantially perpendicular to the exposed sectioned surface.

9. The method of claim 7, wherein inspecting the etched sectioned surface comprises scanning the etched sectioned surface using a scanning electron microscope.

10. The method of claim 7, wherein etching the exposed sectioned surface comprises performing the anisotropic etch process substantially perpendicular to the exposed sectioned surface.

11. A method of delineating an interface between two horizontal layers of different materials in a semiconductor wafer, comprising:

exposing an interior portion of the layers and the interface along a substantially vertical plane; and etching the exposed interior portion using an anisotropic etch process, wherein etching the exposed interior portion comprises etching the interior portion using $CF_4$, $O_2$, and $CHF_3$ gases;

and wherein the etching the exposed interior portion comprises:

providing the $CF_4$ gas at a flow rate of about 5 sccm, the $O_2$ gas at a flow rate of about 3 sccm, and the $CHF_3$ gas at a flow rate of about 40 sccm at a pressure of about 50 mTorr in an etching chamber;

applying a first RF power of about 300 watts to a first electrode spaced from the exposed interior portion; and applying a second RF power of about 75 watts to a second electrode proximate the exposed interior portion.

12. The method of claim 11, wherein etching the exposed interior portion comprises performing a reactive ion etch process substantially perpendicular to the vertical plane of the exposed interior portion.

* * * * *